United States Patent [19]

Chen et al.

[11] Patent Number: 6,103,447
[45] Date of Patent: Aug. 15, 2000

[54] APPROACH TO FORMULATING IRRADIATION SENSITIVE POSITIVE RESISTS

[75] Inventors: Kuang-Jung Chen; Ronald A. DellaGuardia; Wu-Song Huang; Ahmad D. Katnani; Mahmoud M. Khojasteh, all of Poughkeepsie; Qinghuang Lin, Wappingers Falls, all of N.Y.

[73] Assignee: International Business Machines Corp., Armonk, N.Y.

[21] Appl. No.: 09/030,566

[22] Filed: Feb. 25, 1998

[51] Int. Cl.$^7$ ...................................................... G03F 7/004
[52] U.S. Cl. ........................ 430/270.1; 430/905; 430/906; 430/910
[58] Field of Search .................... 430/270.1, 905, 430/906, 910

[56] References Cited

U.S. PATENT DOCUMENTS

| | | | |
|---|---|---|---|
| 4,491,628 | 1/1985 | Ito et al. | 430/176 |
| 5,210,000 | 5/1993 | Thackeray et al. | 430/165 |
| 5,252,435 | 10/1993 | Tani et al. | 430/325 |
| 5,258,257 | 11/1993 | Sinta et al. | 430/192 |
| 5,272,042 | 12/1993 | Allen et al. | 430/270.1 |
| 5,352,564 | 10/1994 | Takeda et al. | 430/270.1 |
| 5,372,912 | 12/1994 | Allen et al. | 430/270.1 |
| 5,585,218 | 12/1996 | Nakano et al. | 430/270.1 |
| 5,585,220 | 12/1996 | Breyta et al. | 430/270.1 |
| 5,609,989 | 3/1997 | Bantu et al. | 430/270.1 |
| 5,627,010 | 5/1997 | Pai et al. | 430/270.1 |
| 5,731,125 | 3/1998 | Yamachika et al. | 430/270.1 |
| 5,736,296 | 4/1998 | Sato et al. | 430/270.1 |
| 5,741,629 | 4/1998 | Chandross et al. | 430/326 |
| 5,744,281 | 4/1998 | Niki et al. | 430/270.1 |
| 5,750,309 | 5/1998 | Hatakeyama et al. | 430/170 |
| 5,837,420 | 11/1998 | Aoai et al. | 430/270.1 |
| 5,874,195 | 2/1999 | Sato et al. | 430/170 |
| 5,948,589 | 9/1999 | Sato et al. | 430/270.1 |
| 5,955,240 | 9/1999 | Sato et al. | 430/270.1 |

FOREIGN PATENT DOCUMENTS

| | | |
|---|---|---|
| 0 679 951 A1 | 11/1995 | European Pat. Off. . |
| 0 701 171 A1 | 3/1996 | European Pat. Off. . |

OTHER PUBLICATIONS

Hattori et al., "Dissolution Inhibition of Phenolic Resins by Diazonaphthoquinone: Effect of Polymer Structure," Jpn. J. Appl. Phys. Part 1, vol. 30, No. 11B, pp. 3125–3131 (Nov. 1991).

127:115290C "Chemically amplification–type positive working resist composition" Photoresist News, Oct. 1996, vol. 55.

*Primary Examiner*—John S. Chu
*Attorney, Agent, or Firm*—Scully, Scott, Murphy & Presser; Steven Capella, Esq.

[57] ABSTRACT

The present invention is directed to a high-performance irradiation sensitive positive-tone resist and to a method of formulating the same. In one aspect, the polymer resin composition of the present invention comprises a blend of at least two miscible aqueous base soluble polymer resins, wherein one of said aqueous base soluble polymer resins of said blend is partially protected with a high activation energy protecting group and the other aqueous base soluble polymer resin of said blend is partially protected with a low activation energy protecting group. A chemically amplified resist system comprising said polymer resin composition; at least one acid generator; and a solvent is also provided herein.

27 Claims, No Drawings

APPROACH TO FORMULATING IRRADIATION SENSITIVE POSITIVE RESISTS

FIELD OF THE INVENTION

The present invention relates to semiconductor manufacturing and, in particular, to a high-performance irradiation sensitive positive-tone resist for use in mid-ultraviolet (UV), deep-UV, extreme UV, X-ray and e-beam lithography and to a method of formulating said positive-tone resist. In one aspect of the present invention, a polymer resin composition comprising a blend of at least two miscible aqueous base soluble polymer resins that are partially protected with different acid labile protecting groups is provided. The present invention also provides a chemically amplified resist system comprising the polymer resin composition of the present invention.

BACKGROUND OF THE INVENTION

In the field of semiconductor manufacturing, optical lithography has been the main stream approach to pattern semiconductor devices. In typical prior art lithography processes, UV light is projected onto a silicon wafer coated with a thin layer of photosensitive resist through a mask that defines a particular circuitry pattern. Exposure to UV light, followed by subsequent baking, induces a photochemical reaction which changes the solubility of the exposed regions of the photosensitive resist. Thereafter, an appropriate developer, usually an aqueous base solution, is used to selectively remove the resist either in the exposed regions (positive-tone resists) or, in the unexposed region (negative-tone resists). The pattern thus defined is then imprinted on the silicon wafer by etching away the regions that are not protected by the resist with a dry or wet etch process.

Many of the currently used resists are chemically amplified positive-tone resists which are made of two major components: The first component of such chemically amplified positive-tone resists is an aqueous base soluble polymer resin where the polar functional groups of the polymer resin are partially protected by acid labile protecting (or so-called blocking) groups. The presence of such protecting, i.e. blocking, groups makes the polymer resin base insoluble. Acid catalyzed deprotection of the protected sites converts the polymer resin back into an aqueous base soluble polymer.

The second major component of prior art chemically amplified positive-tone resists is a photoacid generator. Exposure of these resists to UV irradiation typically generates an acidic catalytic species as a result of the photochemistry of the acid precursor. The catalytic species is believed to induce a cascade of subsequent chemical transformations of the polymer resins that alter the solubility of the exposed regions. Thus, the quantum efficiency of the photochemical event is amplified hundreds or even thousands of times through the catalytic chain reaction. The most commonly employed chemical amplification involves the acid catalyzed deprotection of various partially protected poly(p-hydroxystyrene), poly(acrylic acid), or copolymers thereof for positive-tone resists. The chemical amplification of resist materials are described in detail in U.S. Pat. Nos. 4,491,028 to Ito, U.S. Pat. No. 5,252,435; to Tani, et al.; U.S. Pat. No. 5,258,257 to Sinta, et al.; U.S. Pat. No. 5,352,564 to Takeda, et al.; U.S. Pat. No. 5,210,000 to Thackeray, et al; and U.S. Pat. No. 5,585,220 to Breyta.

The acid labile protecting groups used with the aqueous base soluble polymers can be classified into two distinct groups: (I) High activation energy protecting groups such as t-butyl ester or t-butyl carbonyl groups; and (II) Low activation energy protecting groups such as acetal, ketal or silylether groups.

Resists containing aqueous base soluble polymer resins protected with high activation energy protecting groups generally require a post-exposure baking step to effect the deprotection and solubility switch due to the high bonding energy. In the case of polymer resins containing low activation energy protecting groups, a post-exposure baking step of the resist is not necessarily required because of the facile deprotection chemistry of this group which generally occurs at about room temperature.

Accordingly, each of the foregoing acid labile protecting groups has their own advantages and disadvantages associated therewith. For example, the high activation energy protecting groups tend to give rise to high resolution, but suffer from environmental contamination during the post-exposure delay. On the other hand, the low activation energy protecting groups tend to exhibit robust environmental stability, however they normally suffer from line width slimming and shelf-life problems.

In view of the state of prior art resists, it would be beneficial if a new polymer resin composition could be formulated which incorporates the advantages of both types of protecting groups in a single resist while eliminating the disadvantages associated with each protecting group. That is, there is a continued need to develop a new and improved polymer resin composition which exhibits high resolution upon exposure to UV irradiation, good environmental stability and that could be used to pattern semiconductor circuitries.

SUMMARY OF THE INVENTION

One object of the present invention is provide a simple and highly manufacturable method of formulating high performance positive-tone resists that combine all of the desirable features and/or properties of each of the above-mentioned protecting groups into a single resist.

Another object of the present invention is to provide a method of formulating a positive-tone resist that exhibits high resolution and good environmental stability.

A further object of the present invention is to provide a positive-tone polymer resin composition and resist system that can be used in semiconductor manufacturing, and, in particular, in the patterning of semiconductor circuitries.

These and other objects and advantages are achieved in the present invention by blending at least two miscible aqueous base soluble polymer resins having different acid labile protecting groups together. Specifically, the method of the present invention comprises the step of:

(a) blending one aqueous base soluble polymer resin that is partially protected with a low activation energy protecting group with another aqueous base soluble polymer resin that is partially protected with a high activation energy protecting group, wherein said aqueous base soluble polymer resins are miscible with one another.

In another aspect of the present invention, a polymer resin composition which is employed in fabricating and/or patterning semiconductor devices is provided. Specifically, in this aspect of the present invention, the polymer resin composition comprises a blend of at least two miscible aqueous base soluble polymer resins, wherein one of said aqueous base soluble polymer resins is partially protected with a high activation energy protecting group and the other aqueous base soluble polymer resin is partially protected with a low activation energy protecting group.

A further aspect of the present invention is directed to a positive-tone chemically amplified resist system which comprises (a) the polymer resin composition of the present invention; (b) an acid generator; (c) a solvent for said polymer resin composition; and, optionally, (d) a photosensitizer that is capable of absorbing irradiation in the mid-UV, deep-UV, extreme-UV, X-ray or e-beam range. The chemically amplified resist system of the present invention may further comprise (e) a base and/or (f) a surfactant.

DETAILED DESCRIPTION OF THE INVENTION

In one aspect of the present invention, a polymer resin composition useful in formulating a positive-tone resist which comprises a blend of at least two miscible aqueous base soluble polymer resins, wherein one of said aqueous base soluble polymer resins is partially protected with a high activation energy protecting group and the other aqueous base soluble polymer resin is partially protected with a low activation energy protecting group is provided. The term .miscible. is used herein to denote polymer resins which, after mixing and processing, show no detectable phase separation under optical and/or electron microscopy.

The polymer resins employed in the present are typically well known to those skilled in the resist material art. Generally, the polymer resins employed in the present invention are homopolymers or higher polymers containing two or more repeating monomer units, e.g. copolymers or terpolymers, that are soluble in an alkaline solution after deprotection. Moreover, the polymer resins employed in the present invention contain polar functional groups that readily ionize. The polar functional groups of the polymer resins are generally hydroxyl or carboxyl functionalities.

Illustrative examples of suitable homopolymers that can be utilized in the present invention include, but are not limited to: phenolic-containing resins such as poly (hydroxystyrene) including the meta-, para- or ortho-substituted forms, and phenol formaldehydes; polymers having an acid or an anhydride group, e.g. polyacrylic acid or polymethacrylic acid; or acrylamide, imide or hydroxy-imide group type polymers.

Preferred homopolymers have an average molecular weight within the range of 1000 to 250,000, and preferably within the range of 2000 to 25,000. A highly preferred homopolymer that can be employed as the polymer resin is poly(hydroxystyrene) (PHS), with the para-form being the most preferred.

In regard to polymers which contain at least two monomer units, the monomer units employed in the present invention in forming such polymers are selected from the group consisting of hydroxystyrenes, styrenes, acrylates, acrylic acid, methacrylic acid, vinylcyclohexanol, phenol formaldehydes, methacrylates, acrylamides, maleic anhydrides and maleimides. The higher polymer resins, i.e. copolymers, terpolymers, etc., employed in the present invention have the same molecular weight as expressed for the homopolymers. A highly preferred polymer resin employed in the present invention is one which contains at least two of the following monomer units: hydroxystyrene, styrene, vinylcyclohexanol, acrylic acid, methacrylic acid, acrylate or methacrylate.

The aqueous base soluble polymer resins employed in the present invention also contain a polymeric backbone such as, but limited to: polyolefins, polyolefin sulfones, polysulfones, polycyclic olefins, polycarbonates, polyimides, polyketones, polyethers and the like. A highly preferred polymeric backbone for the aqueous base soluble polymer resin is polyethylene.

The aqueous base soluble polymer resins employed in the present invention are prepared using conventional techniques that are well known to those skilled in the art. These include liquid or gas phase polymerizations or copolymerizations using cationic, anionic or free-radical catalysts or Ziegler-Natta catalysts.

In accordance with the present invention, some, but not all, of the polar functional groups of one of the aqueous base soluble polymer resins are modified, i.e. protected, with a high activation energy protecting group or a low activation energy protecting group. Such protecting groups, which are also called acid labile protecting groups, are well known to those skilled in the art. The other aqueous base soluble polymer resin used in forming the blend has some of its polar functional groups partially protected with whichever protecting group is not employed in the first aqueous base soluble polymer resin.

The term .high activation energy protecting group. denotes those protecting groups which require heat (typically at temperatures of greater than about 70° C.) in order to begin the chemical amplification reaction. Suitable high activation energy protecting groups that can be employed in the present invention include cyclic or branched, e.g., secondary or tertiary, aliphatic carbonyls, esters or ethers containing from about 3 to about 30 carbon groups.

Illustrative examples of cyclic or branched aliphatic carbonyls that may be employed in the present invention include, but are not limited to: phenolic carbonates; t-alkoxycarbonyloxys such as t-butoxylcarbonyloxy; and isopropylcarbonyloxy. A highly preferred carbonate that may be employed in the present invention is t-butoxycarbonyloxy.

Some examples of cyclic and branched ethers that may be employed in the present invention include, but are not limited to: phenolic ethers, benzyl ether and t-alkyl ethers such t-butyl ether. Of the aforesaid ethers it is highly preferred to use t-butyl ether.

Examples of cyclic and branched esters that can be employed in the present invention are carboxylic esters having a cyclic or branched aliphatic substituent such as t-butyl ester, isobornyl ester, 2-methyl-2-admantyl ester, benzyl ester, 3-oxocyclohexanyl ester, dimethypropylmethyl ester, mevalonic lactonyl ester, 3-hydroxy-γ-butyrolactonyl ester, 3-methyl-γ-butylrolactonyl ester, bis(trimethylsilyl) isopropyl ester, trimethylsilylethyl ester, tris(trimethylsilyl) silylethyl ester and cumyl ester.

The low activation energy protecting groups employed in the present invention are those groups which allow for the acid catalyzed deprotection reaction to occur readily at room temperature. Examples of low activation energy protecting groups that can be employed in the present invention include cyclic acetals, aliphatic or cyclic ketals and silylethers.

Some examples of acetals and ketals that can be employed in the present invention include, but are not limited to: phenolic acetals and ketals as well as tetrahydrofuranyl, tetrahydropyranyl, methoxycyclohexanyl, methoxycyclopentanyl, cyclohexanyloxyethyl, ethoxycyclopentanyl, ethoxycyclohexanyl, methoxycycloheptanyl, and ethoxycycloheptanyl. Of these, it is preferred that a methoxycyclohexanyl ketal be employed.

Illustrative examples of silylethers that can be employed in the present invention include, but are not limited to: trimethylsilylether, dimethylethylsilylether and dimethylpropylsilylether. Of these silylethers, it is preferred that trimethylsilylether be employed in the present invention.

It is again emphasized that in the present invention, the polymer resin composition comprises a blend of two miscible aqueous base soluble polymer resins, wherein one of said aqueous base soluble polymer resins is partially protected with a high activation energy protecting group and the other aqueous base soluble polymer resin is partially protected with a low activation energy protecting group. Specifically, in accordance with the present invention, one of the aqueous base soluble polymer resins is partially protected with preferably from about 3 to about 97 mol % of a high activation energy protecting group, whereas the other aqueous base soluble polymer resin is partially protected with preferably from about 3 to about 97 mol % of a low activation energy protecting group. More preferably, one of the aqueous base soluble polymer resins is partially protected with from about 6 to about 45 mol % of a high activation energy protecting group, whereas the other aqueous base soluble polymer resin is partially protected with from about 10 to about 45 mol % of a low activation energy protecting group.

In accordance with the present invention, the polymer resin composition preferably comprises from about 5 to about 95 wt. % of a high activation energy protecting group blocked aqueous base soluble polymer resin. More preferably, the polymer resin composition comprises from about 25 to about 75 wt. % of a high activation energy protecting group blocked aqueous base soluble polymer resin.

The polymer resin composition is preferably prepared in the present invention by blending one aqueous base soluble polymer resin that is partially protected with a low activation energy protecting group with another aqueous base soluble polymer resin that is partially protected with a high activation energy protecting group, wherein said aqueous base soluble polymer resins are miscible with one another. More specifically, the polymer resin compositions are obtained by mixing the two miscible polymers together at a temperature of from about 0° to about 70° C., more preferably from about 15° to about 40° C., in a common organic solvent which is capable of dissolving both polymer resins. Alternatively, the polymer resin compositions are obtained by blending solutions of the two polymers together.

The blending is typically carried out at said temperature for a time period of from about 1 to about 48 hrs. More preferably, the blending is carried out for a time period of from about 5 to about 24 hrs. Suitable organic solvents which can be employed in the blending step include, but are not limited to: ethers, glycol ethers, aromatic hydrocarbons, ketones and esters. The solvents used in the blending step can be the same or different from the solvent used as component (c) of the resist system. Highly preferred organic solvents employed in the blending step are propylene glycol monomethylether acetate (PGMEA), cyclohexanone, ethyl lactate and ethoxy ethyl proponate.

The polymer resin composition of the present invention, i.e., miscible polymer blend, can be used in a chemically amplified resist system which comprises, in addition to the polymer resin composition, a photoacid generator, a solvent for the polymer resin composition, and, optionally a photosensitizer. The chemically amplified resist system of the present invention may further comprise a base and/or a surfactant.

The photoacid generator used in the resist formulation of the present invention are compounds which generate an acid upon exposure to energy. They are commonly employed herein as well as in the prior art for the deprotection of the acid liable protecting groups. Illustrative classes of such acid generators that can be employed in the present invention include, but are not limited to: nitrobenzyl compounds, onium salts, sulfonates, carboxylates and the like. A preferred acid generator employed in the present invention is an onium salt such as an iodonium salt or a sulfonium salt. Examples of photoacid generators are discussed in great length in Sinta, et al. supra, the contents of which are incorporated herein by reference.

The specific photoacid generator selected will depend on the irradiation being used for patterning the resist. Photoacid generators are currently available for a variety of different wavelengths of light from the visible range to the X-ray range; thus, imaging of the resist can be performed using deep-UV, extreme-UV, e-beam, laser or any other irradiation source deemed useful.

The solvents that are employed as component (c) of the resist formulation of the present invention are well known solvents that are employed in the prior art to dissolve acid sensitive polymers. Illustrative examples of such solvents include, but are not limited to: ethers, glycol ethers, aromatic hydrocarbons, ketones, esters and the like may be employed in the present invention.

Suitable glycol ethers that can be employed in the present invention include: 2-methoxyethyl ether (diglyme), ethylene glycol monomethyl ether, propylene glycol monomethyl ether, propylene glycol monomethylether acetate (PGMEA) and the like. Examples of aromatic hydrocarbons that may be employed in the present invention include toluene, xylene and benzene; examples of ketones include methylisobutylketone, 2-heptanone, cycloheptanone, and cyclohexanone; an example of an ether is tetrahydrofuran; whereas ethyl lactate and ethoxy ethyl proponate are examples of esters that can be employed in the present invention. Of the solvents mentioned hereinabove it is preferred that a glycol ether or ester be employed, with PGMEA being the most preferred glycol ether and ethyl lactate is the most preferred ester.

The optional component of the present invention, i.e. the photosensitizer, is composed of compounds containing chromophores that are capable of absorbing irradiation in the mid-UV, deep-UV, extreme-UV, X-ray or e-beam range. Illustrative examples of such compounds include, but are not limited to: 9-anthracene methanol, coumarins, 9,10 -bis (trimethoxysilyl ethynyl) anthracene and polymers containing these chromophores. Of these compounds, it is preferred to use 9-anthracene methanol as the photosensitive compound for I-line irradiation source.

The bases that can be employed in the present invention, as component (e), include, but are not limited to: berberine, cetyltrimethylammonium hydroxide, 1,8-bis (dimethylamino)naphthalene, tetrabutyl ammonium hydroxide (TBAH), amines, polymeric amines and the like. Of these bases, it is preferred that TBAH be employed in the present invention as the base component.

The surfactants that can be employed in the present invention as those that are capable of improving the coating homogeneity of the chemically amplified resist of the present invention. Illustrative examples of such surfactants include: fluorine-containing surfactants such as 3M's FC-430 and siloxane-containing surfactants such as Union Carbide's SILWET series and the like.

In accordance with the present invention, the chemically amplified resist system preferably comprises from about 1 to about 50 wt. % of component (a); from about 0.001 to about 14 wt. % of component (b); and from about 40 to about 99 wt. % of component (c). If a photosensitizer is present, it is preferably present in an amount of from about 0.001 to about 8 wt. %. When a base and/or surfactant are used, they are preferably present in amounts from about 0.01 to about 16 wt. % of said base (component e), and from about 100 to about 1000 ppm of said surfactant (component f). More preferably, the chemically amplified resist system of the present invention comprises from about 2 to about 30 wt. % of component (a); from about 0.005 to about 10 wt. % of component (b); from about 70 to about 95 wt. % of component (c); and, if present, from about 0.002 to about 2 wt. %. of a photosensitizer, from about 0.1 to about 6 wt. % of a base, and from about 250 to about 800 ppm of a surfactant.

The following examples are given to illustrate the scope and spirit of the present invention. Because these examples are given for illustrative purposes only, the invention embodied therein should not be limited thereto.

EXAMPLE 1
Synthesis of 1-methoxycyclohexene (MOCH).

500 mg of p-toluene sulfonic acid monohydrate was placed in a 2000 ml flask. Under house vacuum, the acid was heated with a heat gun to dry the glassware and to get rid of the hydrate from p-toluenesulfonic acid. About 750 ml of dimethoxycyclohexane (from TCI America) was added to the acid and the silicon oil bath under the 2000 ml flask was heated up to about 80°–90° C. The reaction was carried out overnight under house vacuum to pump off the generated methanol. On the second day, the oil bath was raised up to about 110° C. to distill off the 1-methoxycyclohexene. The purity of the MOCH produced was about 95–100%.

EXAMPLE 2
Synthesis of partially methoxycyclohexene protected Maruzen polyhydroxystyrene (PHMC) (10% hydrogenated).

The partially protected polymer was prepared by adding 750 g of propylene glycol mono methyl ether acetate (PGMEA) to 250 g of PHMC with continuous stirring until a clear solution was obtained. This solution was then added in with about 150 mg of oxalic acid. After the acid was dissolved, 90 g of 1-methoxycyclohexene was added to the solution, and the reaction was carried out at room temperature with stirring overnight. The reaction was then quenched with 20 g of basic active aluminum oxide. The protection level of 18.5% on phenol group was determined by C13 NMR.

EXAMPLE 3
Synthesis of ketal protected poly(p-hydroxystyrene).

To a one neck flask equipped with a magnetic stirrer, charged 50 grams of poly(p-hydroxystyrene) and 150 grams of PGMEA. The mixture was stirred at room temperature until the poly(p-hydroxystyrene) dissolved (about 2 hrs.). 30 mg of malonic acid (99%) was then added and stirred for 0.5 hr. This was followed by dropwise addition of 13.915 grams of 2-methoxy propene within 5 min. The solution was stirred at room temperature for 16 hrs. The reaction was then quenched by addition of 4 grams of basic alumina and stirred for an additional 2 hrs. This gave a polymer with 25% ketal protection (C13 NMR).

EXAMPLE 4
Equal weights (5 g) of poly(hydroxystyrene) protected with 25 mol % ketal [Example 3] and a copolymer of 68 mol % hydroxystyrene and 32 mol % t-butylacrylate were dissolved in PGMAE with 5 wt % of di(t-butylphenyl) iodonium camphorsulfonate to make a solution with 20 wt % of solid content. The resulting solution was filtered through a 0.2 um filter and spin coated on 5 inch silicon wafer primed with an adhesion promoter HMDS. The resist was then post apply baked at 110° C. for 60 seconds and exposed to DUV light (248 nm wavelength) on a ASM stepper (0.5 NA). The wafer was then post exposure baked at 110° C. for 60 seconds and double puddle developed with 0.263 TMAH developer for second each. 0.3 µm line and space patterns were resolved.

EXAMPLE 5
Equal weights of the methoxycyclohexane protected polyhydroxystyrene polymer (18.5 mole % protection) [Example 2] and a terpolymer consisting of hydroxystyrene (65 mole %), styrene (20 mole %), and tertiary butyl acrylate (15 mole %) were blended together in PGMEA with 4 wt % of di(t-butylphenyl) iodonium perfluorooctane sulfonate and 0.3 wt % tetra-butyl ammonium hydroxide to make a solution with 15 wt % of solid content. The resulting solution was filtered through a 0.1 µm filter. The resist was spin coated on a 6 inch silicon wafer which had a 900 Angstrom thick coating of IBM BARL (polyether bottom antireflective layer). The resist was post-apply baked (PAB) at 90° C. for 60 seconds and exposed to DUV light (248 nm wavelength) on a GCA stepper (0.53 NA). The wafer was then post-exposure baked (PEB) at 110° C. for 90 seconds. It was developed using a single-spray puddle develop process for 45 seconds with Shipley's LDD26W 0.263 N TMAH developer.

Under these process conditions, the 220 nm nested line/space feature with a 1:1 pitch were resolved. The 250 nm nested lines had 15% exposure latitude. The 250 nm isolated lines had slightly reentrant profiles, however when the post-expose bake was lowered to 105° C., the profiles became more square. The post-exposure delay stability was good and showed less than 30 nm of top growth with 30 minute delay. The post-exposure bake temperature sensitivity was checked at 105° C., 110° C. and 115° C. and found to be less than 1 nm per degree for this resist system.

Since the delay stability, PEB sensitivity and resolution were good, processing at 90° C. PAB and 100° C. PEB was studied. Under these conditions the isolated line profiles were no longer reentrant. It was observed that the nested lines on a pitch of 250 nm line and 375 nm space, showed greater than 40% exposure latitude. This was also observed for the 250 nm isolated lines, and the nested lines on a pitch of 200 nm line and 300 nm space.

EXAMPLE 6
Polymer B and poly MOCH blend.

Equal weights of the polyhydroxystyrene protected with 20% tertiary butyl carbonate (t-BOC) and methoxycyclohexane protected polyhydroxystyrene polymer (18.5 mole % protection) (poly MOCH) [Example 3] were blended together in PGMEA with 4 wt % of di(t-butylphenyl) iodonium perfluorooctane sulfonate and 0.3 wt % tetra-butyl ammonium hydroxide to make a solution with 15 wt % of solid content. The resulting solution was filtered through a 0.1 µm filter. The resist was spin coated on a 6 inch silicon wafer which had a 900 Angstrom thick coating of IBM BARL. The resist was post-apply baked (PAB) at 90° C. for 60 seconds and exposed to DUV light (248 nm wavelength) on a GCA stepper (0.53 NA). The wafer was then post-exposure baked (PEB) at 110° C. for 90 seconds. It was developed using a single-spray puddle develop process for 45 seconds with Shipley's LDD26W 0.263 N TMAH developer.

Under these process conditions, the 220 nm nested lines on a 1:1 pitch were resolved. The 250 nm nested lines had approximately 24% exposure latitude. The 250 nm isolated lines had slightly reentrant profiles. As observed with other blending combinations, when the post-exposure bake was lowered to 105° C., the profiles became more square. The post-exposure delay stability was much better than the resist containing the t-BOC protected PHS polymer alone, and showed less than 30 nm of top growth with 30 minute delay. The post-exposure bake temperature sensitivity was checked at 105° C., 110° C. and 115° C. and found to be less than 3 nm per degree for this resist system.

Since the delay stability, PEB sensitivity and resolution were good, processing at 90° C. PAB and 100° C. PEB was studied. Under these conditions the isolated line profiles were no longer reentrant. It was observed that the 250 nm nested lines on a 1:1 pitch showed 32% exposure latitude. The depth off focus for thes lines was approximately 1 micron. The 225 nm nested lines had a depth of focus of approximately 0.8 microns.

EXAMPLE 7

Equal weights of the copolymer consisting of 65 mole % hydroxystyrene and 35 mole % tertiary butyl acrylate and a methoxycyclohexane protected polyhydroxystyrene polymer (18.5 mole % protection) [Example 2] were blended together in PGMEA with 4 wt % of di(t-butylphenyl) iodonium perfluorooctane sulfonate and 0.3 wt % tetra-butyl ammonium hydroxide to make a solution with 15 wt % of solid content. The resulting solution was filtered through a 0.1 μm filter. The resist was spin coated on a 6 inch silicon wafer which had a 900 Angstrom thick coating of IBM BARL. The resist was post-apply baked (PAB) at 90° C. for 60 seconds and exposed to DUV light (248 nm wavelength) on a GCA stepper (0.53 NA). The wafer was then post-exposure baked (PEB) at 110° C. for 90 seconds. It was developed using a single-spray puddle develop process for 45 seconds with Shipley's LDD26W 0.263 N TMAH developer.

Under these process conditions, the 220 nm nested lines on a 1:1 pitch were resolved. The 250 nm nested lines had approximately 15% exposure latitude. The 250 nm isolated lines had slightly reentrant profiles. As observed with other blending combinations, when the post-expose bake was lowered to 105° C., the profiles became more square. The post-exposure delay stability was better than the resist contained the 65 mol % hydroxystyrene and 35% t-butyl acrylate copolymer alone, and showed less than 50 nm of top growth with 30 minute delay. The post-exposure bake temperature sensitivity was checked at 105° C., 110° C. and 115° C. and found to be less than 1 nm per degree for this resist system.

Since the delay stability, PEB sensitivity and resolution were good, processing at 90° C. PAB and 100° C. PEB was studied. Under these conditions the isolated line profiles were no longer reentrant. It was observed that the nested lines on a pitch of 250 nm line and 375 nm space, showed 28% exposure latitude.

EXAMPLE 8

Equal weights of the polyhydroxystyrene protected with 20% tertiary butyl carbonate (t-BOC) and methoxycyclohexane protected polyhydroxystyrene polymer (18.5 mole % protection)[Example 2] (poly MOCH) were blended together in PGMEA with 2 wt % of triphenylsulfoniumtriflate and 0.2 wt % tetra-butyl ammonium hydroxide to make a solution with 15 wt % of solid content. The resulting solution was filtered through a 0.1 μm filter. The resist was spin coated on a 6 inch silicon wafer which had a 900 Angstrom thick coating IBM BARL. The resist was post-apply baked (PAB) at 90° C. for 60 seconds and exposed to DUV light (248 nm wavelength) on a GCA stepper (0.53 NA). The wafer was then post-exposure baked (PEB) at 100° C. for 90 seconds. It was developed using a single-spray puddle develop process for 45 seconds with Shipley's LDD26W 0.263 N TMAH developer.

Under these process conditions, the 225 nm nested lines on a 1:1 pitch were resolved. The 250 nm nested lines had approximately 14% exposure latitude, which was the lowest latitude for any of the blended combinations tested. The 250 nm isolated lines had a .matchhead. profiles. It was determined that this PAG did not perform as well as the others tested.

EXAMPLE 9

Poly B and poly MOCH blend.

Equal weights of the polyhydroxystyrene protected with 20% tertiary butyl carbonate (t-BOC) and methoxycyclohexane protected polyhydroxystyrene polymer (18.5 mole % protection) (poly MOCH) [Example 2] were blended together in PGMEA with 4 wt % of di(t-butylphenyl) iodonium perfluorooctane sulfonate and 0.3 wt % tetra-butyl ammonium hydroxide to make a solution with 15 wt % of solid content. The resulting solution was filtered through a 0.1 μm filter. The resist was spin coated on a 6 inch silicon wafer which had a 900 Angstrom thick coating of IBM BARL. The resist was poly-apply baked (PAB) at 100° C. for 60 seconds and exposed to DUV light (248 nm wavelength) on a GCA stepper (0.53 NA). The wafer was then post-exposure baked (PEB) at 100° C. for 90 seconds. It was developed using a single-spray puddle develop process for 45 seconds with Shipley's LDD26W 0.263 N TMAH developer.

Under these process conditions, the 220 nm nested lines on a 1:1 pitch were resolved. The 250 nm nested lines had approximately 16% exposure latitude. The 250 nm isolated lines had square profiles. The post-exposure delay stability was much better than POLY-B alone, and showed minimal change with 30 minute dalay. The focus latitude under the conditions of 100/100 degree PAB/PEB was the best observed with 1.2 micron depth of focus.

COMPARATIVE EXAMPLE 1

Polyhydroxystyrene protected with 22% tertiary butyl carbonate (t-BOC) was dissolved in PGMEA with 4 wt % of di(t-butylphenyl) iodonium perfluorocamphor sulfonate and 0.3 wt % tetra-butyl ammonium hydroxide to make a solution with 15 wt % of solid content. The resulting solution was filtered through a 0.1 μm filter. The resist was spin coated on a 6 inch silicon wafer which had a 900 Angstrom thick coating of IBM BARL. The resist was post-apply baked (PAB) at 90° C. for 60 seconds and exposed to DUV light (248 nm wavelength) on a GCA stepper (0.53 NA). The wafer was then post-exposure baked (PEB) at 110° C. for 90 seconds. It was developed using a single-spray puddle develop process for 45 seconds with Shipley's LDD26W 0.263 N TMAH developer.

Under these process conditions, the 210 nm nested on a 1:1 pitch were resolved. The 250 nm nested lines had approximately 28% exposure latitude. One limitation of this system was the post-exposure delay stability, which was less than 30 minutes.

COMPARATIVE EXAMPLE 2

A copolymer consisting of 65 mole % hydroxystyrene and 35 mole % tertiary butyl acrylate was dissolved in ethyl lactate with 4 wt % of di(t-butylphenyl) iodonium perfluorooctane sulfonate and 0.3 wt % tetra-butyl ammonium hydroxide to make a solution with 15 wt % of solid content. The resulting solution was filtered through a 0.1 μm filter. The resist was spin coated on a 6 inch silicon wafer which had a 900 Angstrom thick coating of IBM BARL. The resist was post-apply baked (PAB) at 90° C. for 60 seconds and exposed to DUV light (248 nm wavelength) on a GCA stepper (0.53 NA). The wafer was then post-exposure baked (PEB) at 110° C. for 90 seconds. It was developed using a single-spray puddle develop process for 45 seconds with Shipley's LDD26W 0.263 N TMAH developer.

Under these process conditions, the 200 nm nested lines on a 1:1 pitch were resolved. The 250 nm nested lines had approximately 16 % exposure latitude. The 250 nm isolated lines had a depth of focus of approximately 0.8 microns. The post-exposure delay stability showed unacceptable t-topping after 30 minutes.

While the invention has been particularly shown and described with respect to preferred embodiments thereof, it will be understood by those skilled in the art that the foregoing and other changes in form and detail may be made without departing from the spirit and scope of the invention.

Having thus described our invention, what we claim as new, and desire to secure by letters patent is:

1. (Amended) A chemically amplified resist system comprising:
   (a) a polymer resin composition, wherein said polymer resin composition comprises a blend of at least two miscible aqueous base soluble polymer resins, each aqueous base soluble polymer resin having polar functional groups, wherein one of said aqueous base soluble polymer resins has its polar functional groups partially protected with a high activation energy protective group and the other aqueous base soluble polymer resin has its polar functional groups partially protected with a low activation energy protecting group, said low activation energy protecting group being a cyclic ketal or a silylether;
   (b) an acid generator; and
   (c) a solvent for said polymer resin composition.

2. The chemically amplified resist system of claim 1 further comprising one or more of: (d) a photosensitizer that is capable of absorbing irradiation in the mid-UV, deep-UV, extreme-UV, X-ray or e-beam range; (e) a base; and (f) a surfactant.

3. The chemically amplified resist system of claim 1 wherein said miscible aqueous base soluble polymer resins contain hydroxyl or carboxyl functional groups.

4. The chemically amplified resist system of claim 1 wherein said miscible aqueous base soluble polymer resins contain a polymeric backbone selected from the group consisting of polyolefins, polyolefin sulfones, polysulfones, polycyclic olefins, polycarbonates, polyimides, polyketones and polyethers.

5. The chemically amplified resist system of claim 1 wherein said miscible aqueous base soluble polymer resins are homopolymers or polymers having two or more monomer units.

6. The chemically amplified resist system of claim 5 wherein said homopolymer is selected from the group consisting of phenolic-containing resins, polymers having an acid or anhydride group, and acrylamide, imide or hydroxyimide group type polymers.

7. The chemically amplified resist system of claim 6 wherein said homopolymer is a phenolic-containing resin.

8. The chemically amplified resist system of claim 7 wherein said phenolic-containing resin is poly(hydroxystyrene).

9. The chemically amplified resist system of claim 5 wherein said polymers containing at least two monomer units which are selected from the group consisting of hydroxystyrenes, styrenes, acrylates, acrylic acid, methacrylic acid, vinylcyclohexanol, phenol formaldehydes, methacrylates, acrylamides, maleic anhydrides and maleimides.

10. The chemically amplified resist system of claim 1 wherein said high activation energy protecting group is selected from the group consisting of cyclic or branched aliphatic carbonyls, esters and ethers containing from about 3 to about 30 carbon atoms.

11. The chemically amplified resist system of claim 10 wherein said high activation energy protecting group is a cyclic or branched aliphatic carbonyl selected from the group consisting of phenolic carbonates, t-butoxylcarbonyloxy and isopropyloxycarbonyloxy.

12. The chemically amplified resist system of claim 10 wherein said high activation energy protecting group is a cyclic or branched aliphatic ether selected from the group consisting of phenolic esters, t-butyl ether and benzyl ether.

13. The chemically amplified resist system of claim 10 wherein said high activation energy protecting group is a cyclic or branched aliphatic ester selected from the group consisting of t-butyl ester, isobornyl ester, 2-methyl-2-admantyl ester, benzyl ester, 3-oxocyclohexanyl ester, dimethypropylmethyl ester, mevalonic lactonyl ester, 3hydroxy-γ-butyrolactonyl ester, 3-methyl-γ-butylrolactonyl ester, bis(trimethylsilyl)isopropyl ester, trimethylsilylethyl ester, tris(trimethylsilyl)silylethyl ester, cumyl ester and tetrahydropyranyl ester.

14. The chemically amplified resist system of claim 1 wherein said cyclic ketal is selected from the group consisting of phenolic ketals, methoxycyclohexanyl, methoxycyclopentanyl, cyclohexanyloxyethyl, ethoxycyclopentanyl, ethoxycyclohexanyl, methoxycycloheptanyl and ethoxycycloheptanyl.

15. The chemically amplified resist system of claim 1 wherein said silylether is trimethysilylether, dimethylethylsilylether or dimethylpropylsilylether.

16. The chemically amplified resist system of claim 1 wherein one of said aqueous base soluble polymer resins is partially protected with from about 3 to about 97 mol % of said high activation energy protecting group and said other aqueous base soluble polymer resin is partially protected with from about 3 to about 97 mol % of said low activation energy protecting group.

17. The chemically amplified resist of claim 16 wherein one of said aqueous soluble base polymer resins is partially protected with from about 6 to about 45 mol % of said high activation energy protecting group, and said other aqueous base soluble polymer resin is partially protected with from about 10 to about 45 mol % of said low activation energy protecting group.

18. The chemically amplified resist system of claim 1 wherein said resin composition comprises from about 5 to about 95 wt. % of said high activation energy protecting group blocked aqueous base soluble polymer resin.

19. The chemically amplified resist system of claim 18 wherein said resin composition comprises from about 25 to about 75 wt. % of said high activation energy protecting group blocked aqueous base polymer resin.

20. The chemically amplified resist system of claim 2 wherein said resist system comprises from about 1 to about 50 wt % of component (a); from about 0.001 to about 14 wt % of component (b); from about 40 to about 99 wt % of component (c); and when present from about 0.001 to about 8 wt % of component (d), from about 0.01 to about 16 wt % of component (e), and from about 100 to about 1000 ppm of component (f).

21. The chemically amplified resist system of claim 20, wherein said resist system comprises from about 2 to about 30 wt % of component (a); from about 0.005 to about 10 wt % of component (b); from about 70 to about 95 wt % of component (c); and when present from about 0.002 to about 2 wt % of component (d), from about 0.1 to about 6 wt % of component (e), and from about 250 to about 800 ppm of component (f).

22. The chemically amplified resist system of claim 1 wherein said photoacid generator is selected from the group consisting of nitrobenzyl compounds, onium salts, sulfonates and carboxylates.

23. The chemically amplified resist system of claim 1 wherein said solvent is selected from the group consisting of ethers, glycol ethers, aromatic hydrocarbons, lactones and esters.

24. The chemically amplified resist system of claim 2 wherein said photosensitizer is selected from the group consisting of anthracene methanol, coumarins and 9,10-bis (trimethoxysilyl ethynyl) anthracene.

25. The chemically amplified resist system of claim 2 wherein said base is selected from the group consisting of berberine, cetyltrimethylammonium hydroxide, 1,8-bis (dimethylamine)-naphthalene, tetrabutyl ammonium hydroxide, amines and polymeric amines.

26. The chemically amplified resist system of claim 2 wherein said surfactant is a fluorine-containing surfactant or a siloxane-containing surfactant.

27. A resist for use in semiconductor manufacturing comprising a blend of at least two miscible aqueous base soluble polymer resins, each aqueous base soluble polymer resin having polar functional groups, wherein one of said aqueous base soluble polymer resins has its polar functional groups partially protected with a high activation energy protecting group and the other aqueous base soluble polymer resin has its polar functional groups partially protected with a low activation energy protecting group, said low activation energy protecting group being a cyclic ketal or a silylether.

* * * * *

UNITED STATES PATENT AND TRADEMARK OFFICE
CERTIFICATE OF CORRECTION

PATENT NO. : 6,103,447
DATED : August 15, 2000
INVENTOR(S) : K.J. Chen, et al.

It is certified that error appears in the above-identified patent and that said Letters Patent is hereby corrected as shown below:

Column 4,
Line 23, "term .high" should read -- term high --
Line 24, "group. denotes" should read -- group denotes --
Line 25, "70 C.)" should read -- 70 C ). --

Column 11,
Line 31, example 1: Delete -- (Amended) --

Column 12,
Line 34, "3hydroxy" should read -- 3-hydroxy --

Signed and Sealed this

Sixteenth Day of October, 2001

Attest:

NICHOLAS P. GODICI
Attesting Officer  Acting Director of the United States Patent and Trademark Office